United States Patent
Yang et al.

(10) Patent No.: US 7,250,335 B2
(45) Date of Patent: Jul. 31, 2007

(54) METHODS OF FABRICATING INTEGRATED CIRCUIT DEVICES INCLUDING SELF-ALIGNED CONTACTS WITH INCREASED ALIGNMENT MARGIN

(75) Inventors: Won-suk Yang, Kyungki-do (KR); Ki-nam Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 92 days.

(21) Appl. No.: 11/201,803

(22) Filed: Aug. 11, 2005

(65) Prior Publication Data

US 2005/0272251 A1    Dec. 8, 2005

Related U.S. Application Data

(62) Division of application No. 10/156,477, filed on May 28, 2002, now Pat. No. 6,953,959.

(30) Foreign Application Priority Data

May 29, 2001   (KR) ............................. 2001-29731

(51) Int. Cl.
   *H01L 21/8239* (2006.01)
(52) U.S. Cl. ................ 438/239; 438/294; 438/296; 438/618; 438/669; 438/672; 438/692; 257/E21.304; 257/E21.305
(58) Field of Classification Search ................ 438/239, 438/294, 296, 618, 669, 672, 692; 257/E21.304, 257/E21.305
   See application file for complete search history.

(56) References Cited

U.S. PATENT DOCUMENTS 5,877,522 A    3/1999 Kasi (Continued)

FOREIGN PATENT DOCUMENTS

JP    20000269333    11/2001

(Continued)

OTHER PUBLICATIONS

Notice to Submit Response, Korean Application No. 10-2001-0029731, Jan. 29, 2003.

(Continued)

*Primary Examiner*—George Fourson
(74) *Attorney, Agent, or Firm*—Myers Bigel Sibley & Sajovec PA

(57) ABSTRACT

An integrated circuit device, e.g., a memory device, includes a substrate, and a plurality of rows of active regions in the substrate, the active regions arranged in a staggered pattern such that active regions of a first row are aligned with portions of an isolation region separating active regions of an adjacent second row. Source and drain regions are in the active regions and are arranged such that each active region comprises a drain region disposed between two source regions. A plurality of word line structures are on the substrate, arranged transverse to the rows of active regions such that that word line structures cross the active regions between the source regions and the drain regions. Respective rows of conductive pads are disposed between respective adjacent word lines structures, including first conductive pads on the source regions, second conductive pads on the drain regions, and third conductive on isolation regions separating active regions. A plurality of bit line structures are on the substrate, extending transverse to the word line structures and contacting the second conductive pads. Related methods of fabrication are also described.

14 Claims, 17 Drawing Sheets

U.S. PATENT DOCUMENTS

| | | |
|---|---|---|
| 6,174,767 B1 | 1/2001 | Chi |
| 6,187,627 B1 | 2/2001 | Chen et al. |
| 6,214,688 B1 * | 4/2001 | Hwang et al. ............... 438/396 |
| 6,320,240 B1 | 11/2001 | Miyoshi |
| 2002/0192924 A1 * | 12/2002 | Hwang et al. ............... 438/396 |
| 2004/0007725 A1 * | 1/2004 | Son ............................ 257/296 |

FOREIGN PATENT DOCUMENTS

| | | |
|---|---|---|
| KR | 2000-66345 | 11/2000 |

OTHER PUBLICATIONS

Kohyama, et al., "A Fully Printable, Self-aligned and Planarized Stacked Capacitor DRAM Cell Technology for 1Gbit DRAM and Beyond," 1997 Symposium on VLSI Technology Digest of Technical Papers, pp. 17-18.

Office Action, German Patent Application No. 102 23 748.4-33, Jan. 24, 2007.

Office Action, German Application No. 102 23 748.4-33, Jun. 2, 2005.

* cited by examiner

METHODS OF FABRICATING INTEGRATED CIRCUIT DEVICES INCLUDING SELF-ALIGNED CONTACTS WITH INCREASED ALIGNMENT MARGIN

CLAIM FOR PRIORITY AND RELATED APPLICATIONS

This application claims priority to and is a divisional of parent application Ser. No. 10/156,477, filed May 28, 2002 now U.S. Pat. No. 6,953,959 the disclosure of which is hereby incorporated herein by reference, which claims the benefit of Korean Application No. 2001-29731, filed May 29, 2001, the disclosure of which is hereby incorporated herein by reference.

FIELD OF THE INVENTION

The present invention relates to integrated circuit devices and methods for fabricating the same, and more particularly, to integrated circuit devices, such as integrated circuit memory devices, with self-aligned contact (SAC) pads and methods of fabricating the same.

As memory devices are designed to operate at higher speeds and to have a larger storage capacity, the integration density of integrated circuit memory devices has generally increased. For example, as the integration density of dynamic random access memories (DRAMs) has increased to more than a gigabyte, the design rule has decreased below 0.18 µm. Horizontal gaps between individual devices, vertical gaps between layers, and misalignment margins have typically been reduced in proportion to the decreasing design rule. Accordingly, defects, such as poor contact filling or misalignment, may occur.

A conventional integrated circuit memory device employing a self-aligned contact method will be described with reference to FIGS. 1 and 2. Referring to FIGS. 1 and 2, an isolation layer 12 is formed on a semiconductor substrate 10, thereby defining active regions 11. Peripheral circuit regions (not shown) and core regions (not shown) may also be defined by the isolation layer 12. Next, a gate insulating layer 13, a gate conductive layer 14, and a capping layer 15 are sequentially deposited on the semiconductor substrate 10. Predetermined portions of the capping layer 15 and the gate conductive layer 14 are patterned. Spacers 16 are formed at the sidewalls of the remaining portions of the capping layer 15 and the remaining gate conductive layer 14, thereby forming word line structures 17.

As shown in FIG. 1, the word line structures 17 extend in a Y direction across the active regions 11, and are spaced a predetermined distance away from one another. A pair of word line structures 17 crosses each active region 11. Impurities for a source and a drain are implanted in the active region 11 on both sides of each of the word line structures 17, thereby forming a source region 18a and a drain region 18b in each active region 11.

An etch stopper (not shown) and an interlayer insulating layer 19 are sequentially deposited on the semiconductor substrate. The interlayer insulating layer 19 fills spaces between adjacent word line structures 17. The interlayer insulating layer 19 and the etch stopper are etched to expose the source and drain regions 18a and 18b. Then, a conductive polysilicon layer (not shown) is deposited on the semiconductor substrate 10 to contact the exposed source and drain regions 18a and 18b. The polysilicon layer is preferably deposited to a thickness sufficient to fill spaces between the adjacent word line structures 17. The polysilicon layer is chemically and mechanically polished until the interlayer insulating layer 19 is exposed, thereby forming self-aligned contact (SAC) pads 20a and 20b in contact with the source and drain regions 18a and 18b, respectively. The self-aligned contact pads 20b in contact with the drain regions 18b partially occupy spaces 21 between the active regions 11, as bit lines (not shown) will be arranged to be perpendicular to the word line structures 17 in the spaces 21 between the active regions 11. The self-aligned contact pad 20b in contact with the drain region 18b will be in contact with the bit lines (not shown), and the self-aligned contact pad 20a in contact with the source region 18a will be in contact with a storage node electrode.

Such a conventional memory structure may have the following problems: Even though the contact pads 20a and 20b are self-aligned, it may be difficult to precisely align the openings at which the self-aligned contact pads 20a and 20b will be formed because the integration density of the memory device. Thus, adjacent self-aligned contact pads 20a and 20b may not be completely isolated from each other, and a bridge may occur.

As indicated by "3D" of FIG. 1, the self-aligned contact pads 20a and 20b are three-dimensional structures. If light is simultaneously applied along the three dimensions of the self-aligned contact pads 20a and 20b, an interference effect may occur around corners of the structures. In addition, if light is applied in three different directions, it may be difficult to focus. Accordingly, it may be difficult to align openings at which self-aligned contact pads will be formed.

In addition, because the size of the self-aligned contact 20a in contact with the source region 18a is different from the size of the self-aligned contact 20b in contact with the drain region 18b, it may be difficult to uniformly control the degree to which the interlayer insulating layer 19 is etched in order to form openings for the contacts. In some conventional memory devices, only the regions at which the self-aligned contact pads 20a and 20b will be formed are opened before forming the self-aligned contact pads 20a and 20b. Due to the aspect ratio of the word line structures 17, voids may be formed in the interlayer insulating layer 19 filling the space between the word line structures 17. The voids may become larger during formation of the openings for the self-aligned contact regions. During forming the self-aligned contact pads 20a and 20b, a polysilicon layer used to form the self-aligned contact pads 20a and 20b may fill the voids, and thus parasitic conductive lines (not shown) arranged parallel to word lines between the word line structures 17 may be generated. Because such parasitic conductive lines exist in the interlayer insulating layer 19, it may be difficult to detect them through superficial observation of the memory device.

SUMMARY OF THE INVENTION

According to some embodiments of the present invention, an integrated circuit device, such as an integrated circuit memory device, includes a substrate and a plurality of rows of active regions in the substrate, the active regions arranged in a staggered pattern such that active regions of a first row are aligned with portions of an isolation region separating active regions of an adjacent second row. Source and drain regions are in the active regions and are arranged such that each active region comprises a drain region disposed between two source regions. A plurality of word line structures are on the substrate, arranged transverse to the rows of active regions such that that word line structures cross the active regions between the source regions and the drain regions. Respective rows of conductive pads are disposed between respective adjacent word lines structures, including first conductive pads on the source regions, second conductive pads on the drain regions, and third conductive on isolation regions separating active regions. A plurality of bit line structures are on the substrate, extending transverse to the word line structures and contacting the second conductive pads.

According to certain embodiments, an interlayer insulating layer is on the substrate. The bit line structures may comprise a plurality of conductive plugs extending though the interlayer insulating layer to contact the second conductive pads. The conductive plugs may also contact the third conductive pads. The bit line structures may comprise conductive lines disposed on the interlayer insulating layer and in contact with the conductive plugs. Because of the configuration of the device, formation of the conductive plugs may be more easily fabricated and less prone to alignment errors.

In some method embodiments according to the present invention, An isolation region defining a plurality of rows of active regions in a substrate is formed. The active regions are arranged in a staggered pattern such that active regions of a first row are aligned with portions of the isolation region separating active regions of an adjacent second row. A plurality of word line structures is formed on the substrate, arranged transverse to the active regions such that that word line structures cross the active regions between the source regions and the drain regions. Source regions and drain regions are formed in portions of the active regions disposed between the word line structures, the source regions and drain regions arranged such that each active region comprises a drain region disposed between two source regions. Respective rows of conductive pads are formed between respective adjacent word lines structures including first conductive pads on the source regions, second conductive pads on the drain regions, and third conductive pads on portions of the isolation region separating active regions. A plurality of bit line structures is formed on the substrate, extending transverse to the word line structures and contacting the second conductive pads.

An interlayer insulating layer may be formed on the conductive pads. The plurality of bit line structures may be formed by forming a plurality of conductive plugs extending though the interlayer insulating layer to contact the second conductive pads. Forming a plurality of word line structures may comprise forming capped word line structures, each comprising a conductive line on the substrate, a capping layer on the conductive line, and sidewall insulators on sidewalls of the conductive line. Forming source and drain regions in the active regions may comprise implanting impurities into portions of the active regions between the capped word line structures. Forming respective rows of contact pads may comprise forming a plurality of spaced apart insulation regions on the substrate transverse to the capped word line structures, the insulation regions extending to contact portions of the isolation region between the capped word line structures, forming a conductive layer on the substrate, the conductive layer filling gaps between the spaced apart insulation regions and extending to contact the source and drain regions, and removing a portion of the conductive layer to form the rows of contact pads.

Forming a plurality of spaced apart insulation regions may comprise forming a plurality of spaced apart mask regions transverse to the capped word line structures, respective ones of the spaced apart mask regions overlying a respective row of the active regions, forming an insulation layer on the substrate, the insulation layer filling gaps between the spaced apart mask regions, and removing a portion of the insulation layer to form the plurality of spaced apart insulation regions. The mask regions may comprise a photoresist material, and forming an insulation layer may comprise depositing an insulating material at a temperature sufficiently low to maintain integrity of the mask regions. Forming a conductive layer may be preceded by removing the mask regions to expose the source and drain regions, and forming a conductive layer may comprise forming a conductive layer that fills gaps between the insulation regions and contacts the exposed source and drain regions.

DETAILED DESCRIPTION OF THE INVENTION

Figure 1:
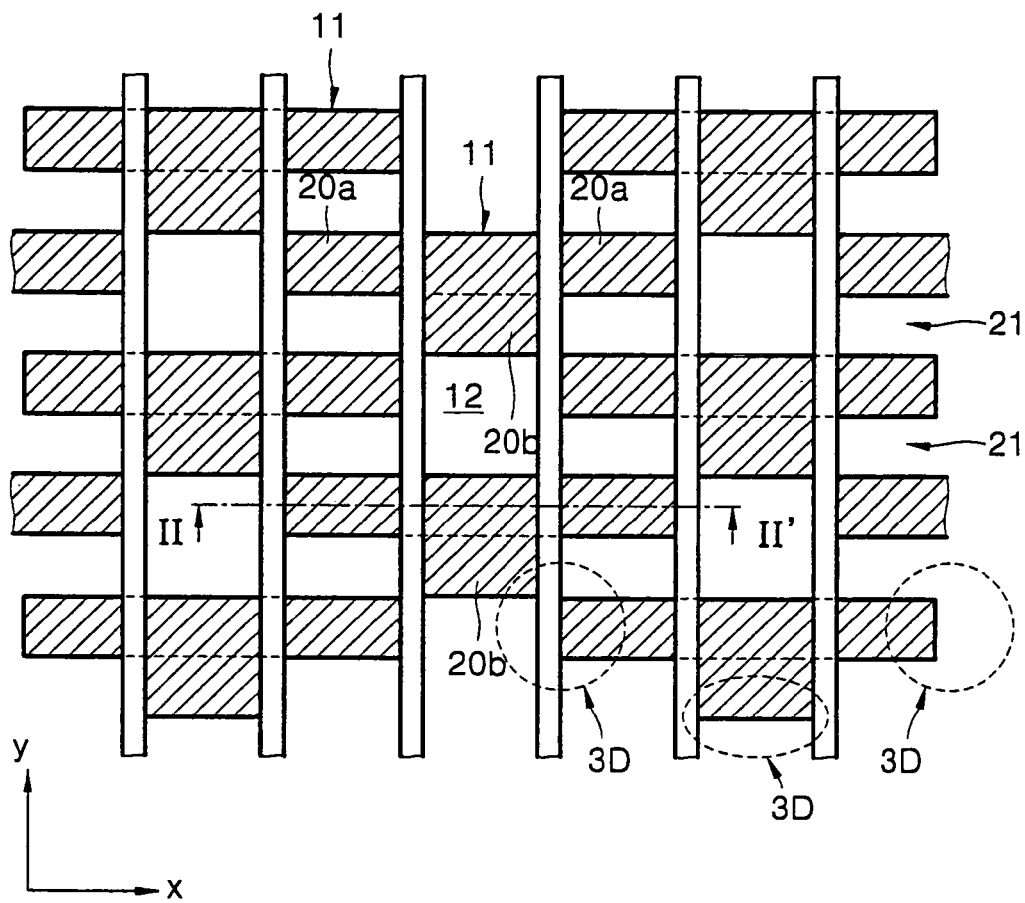
FIG. 1 is a plan view of a conventional memory device.
Figure 2:
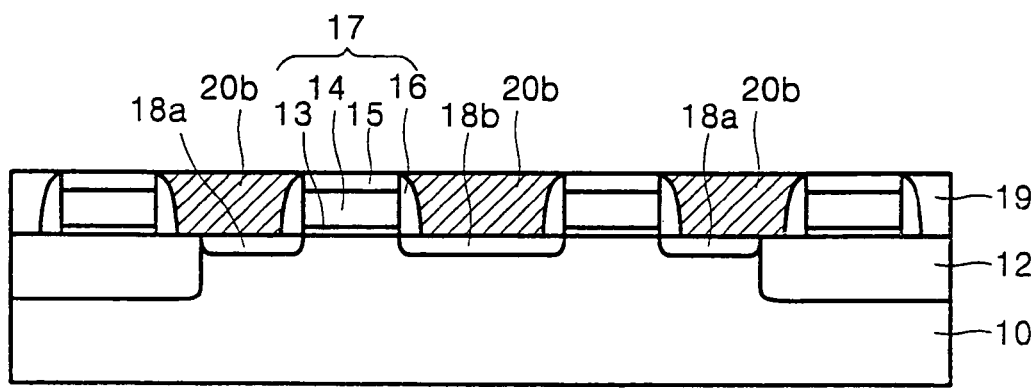
FIG. 2 is a cross-sectional view of the conventional memory device taken along line II–II' of FIG. 1.
Figure 3:
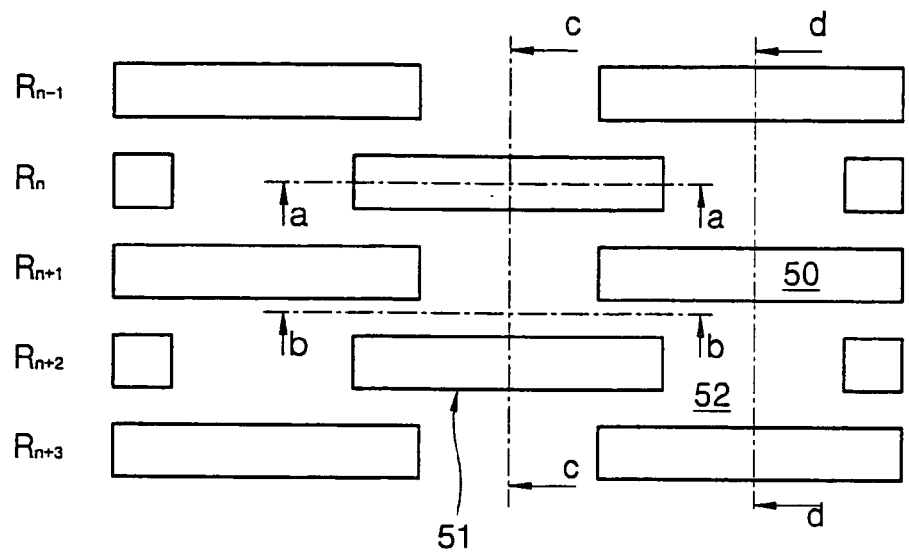
FIGS. 3 through 8 are plan views illustrating fabrication products and operations for manufacturing a memory device according to some embodiments of the present invention.
Figure 4:
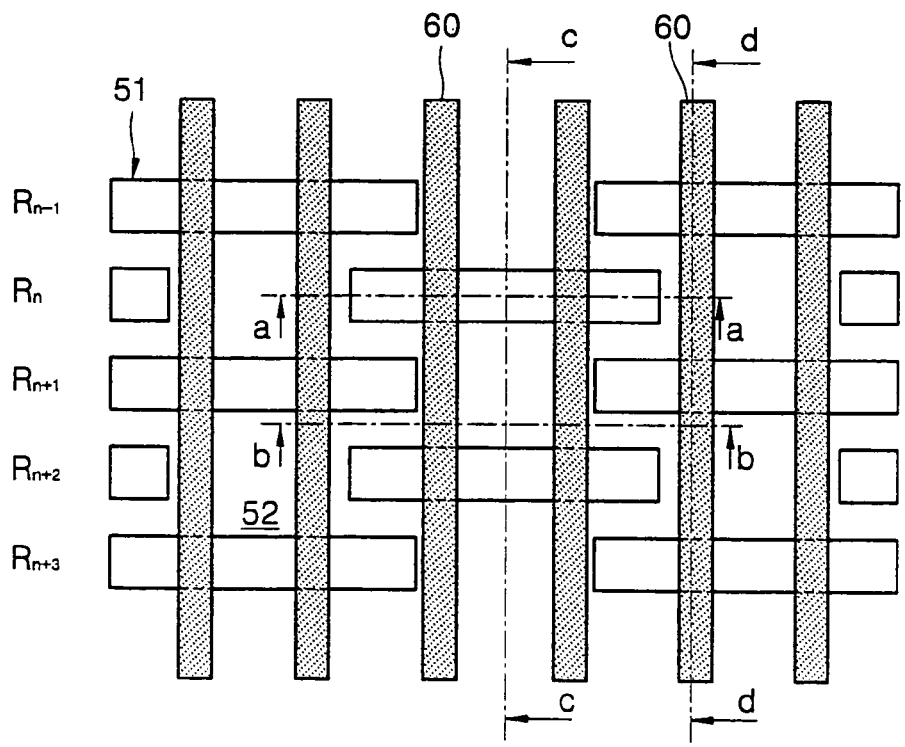
Figure 5:
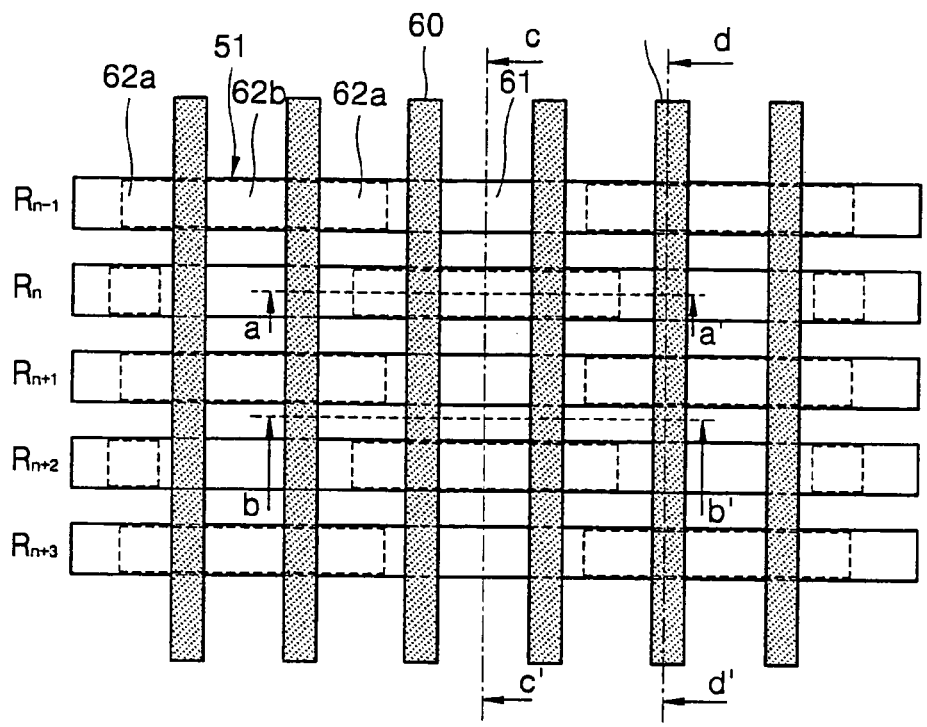
Figure 6:
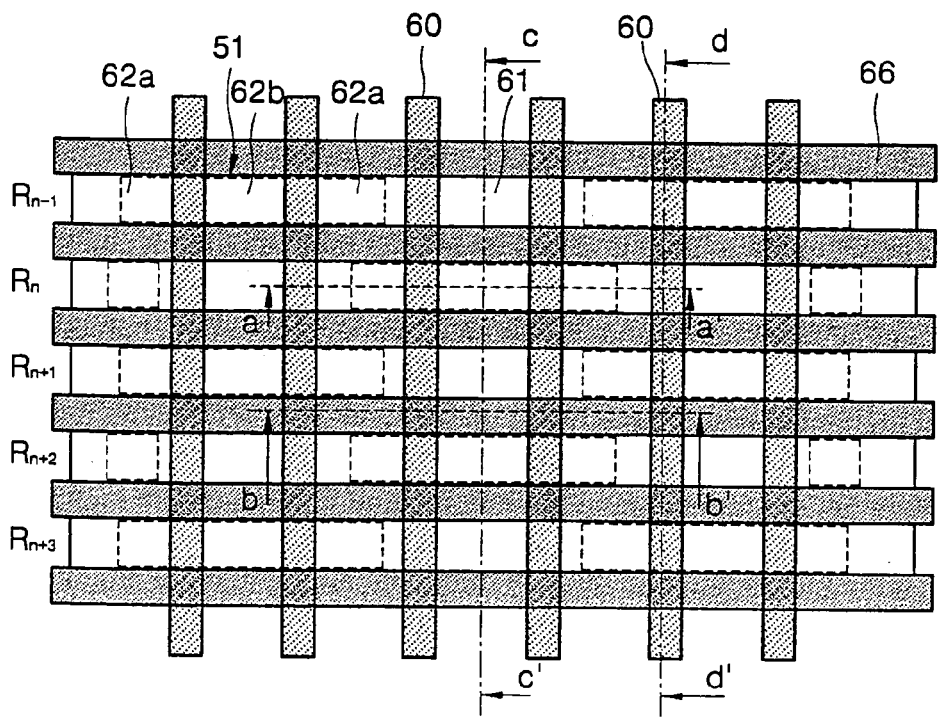

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Referring to FIGS. 3 and 9A through 9D, a semiconductor substrate 50 is prepared. The semiconductor substrate 50 may be, for example, a silicon substrate including p-type or n-type impurities. A well region (not shown) is formed in the semiconductor substrate 50. An isolation layer 52 is formed in the semiconductor substrate 50 using, for example, a shallow trench isolation (STI) method, thereby defining active regions 51 on which devices will be formed. The active regions 51 are arranged in rows Rn−1, Rn, Rn+1, Rn+2, . . . The rows Rn−1, Rn, Rn+1, Rn+2 . . . are arranged in a staggered fashion, i.e., an active region 51 belonging to a particular row Rn is aligned with a portion of the isolation layer 52 between two adjacent active regions 51 of an adjacent row Rn+1.

Referring to FIGS. 4 and 10A through 10D, a gate insulating layer 54, a conductive layer 56 for a gate electrode, and a capping layer 58 are sequentially deposited on the semiconductor substrate 50. The gate conductive layer 56 may be formed of a doped polysilicon layer. A transition metal silicide layer may be formed between the gate conductive layer 56 and the capping layer 58. The capping layer 58 may be formed of a material, such as a silicon nitride layer SiN or a silicon oxy nitride layer (SiON), having a superior etching selectivity to an interlayer insulating layer to be later formed. Next, the capping layer 58 and the gate conductive layer 56 are patterned into a line shape so as to cross the longitudinal axis of each of the active regions 51. Next, an insulating layer for spacers is deposited on the semiconductor substrate 50. The insulating layer may be formed of the same material as the capping layer 58. The insulating layer is anisotropically etched, thereby forming insulating spacers 59 at the sides of the gate conductive layer 56 and the capping layer 58.

Structures including the gate insulating layer 54, the gate conductive layer 56, the capping layer 58, and the insulating spacers 59 are referred to herein as word line structures 60. The word line structures 60 are spaced a predetermined distance away from one another in parallel to one another. A pair of word line structures 60 cross each active region 51. The active regions 51 may be each divided into three approximately equal parts.

Referring to FIGS. 5 and 11A through 11D, n-type impurities are implanted in portions of the active regions 51 at either side of each of the word line structures 60, thereby forming source regions 62a and drain regions 62b. A photoresist layer is then deposited to a predetermined thickness on the substrate 50 on which the word line structures 60 are formed. The photoresist layer is deposited to a thickness sufficient to fill spaces between the word line structures 60. The photoresist layer is exposed and developed so that portions 64 of the photoresist layer remain on the rows of the active regions 51. The photoresist patterns 64 cross the word line structures 60 and are spaced a predetermined distance away from one another. The photoresist patterns 64 can be removed without damage to the active regions 51.

Referring to FIGS. 6 and 12A through 12D, an oxide layer 66 is formed on the semiconductor substrate 50. The oxide layer 66 is formed to a thickness sufficient to fill spaces between the photoresist patterns 64, and is preferably deposited at a low temperature, for example at a temperature of 150–250° C. The oxide layer 66 is etched back to expose the photoresist patterns 64, leaving the spaces between the photoresist patterns 64 filled with the oxide layer 66.

Figure 7:
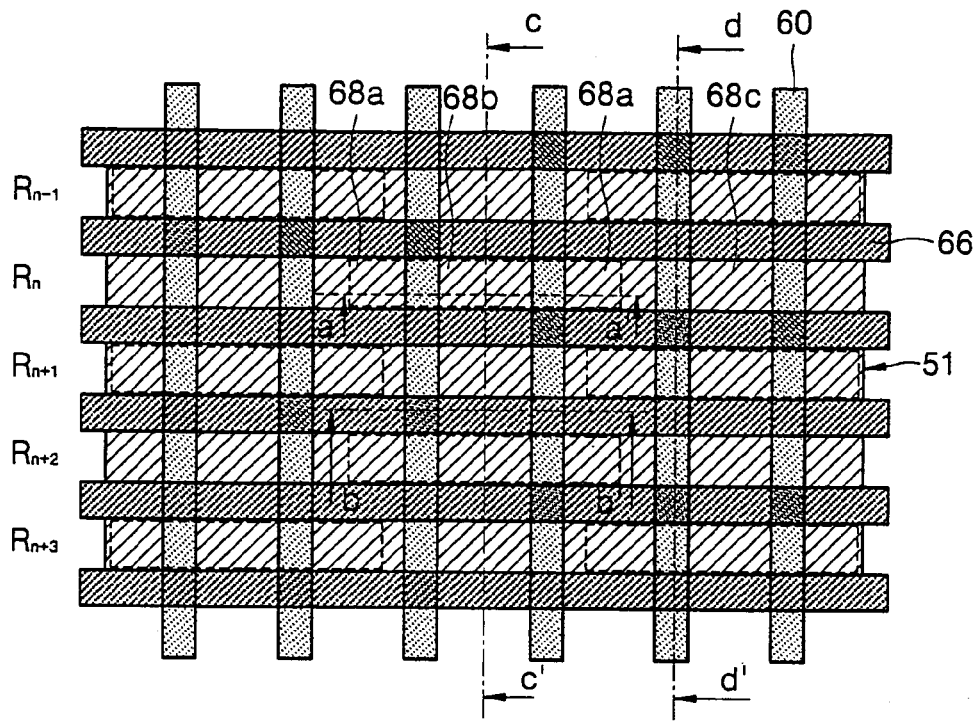
Figure 8:
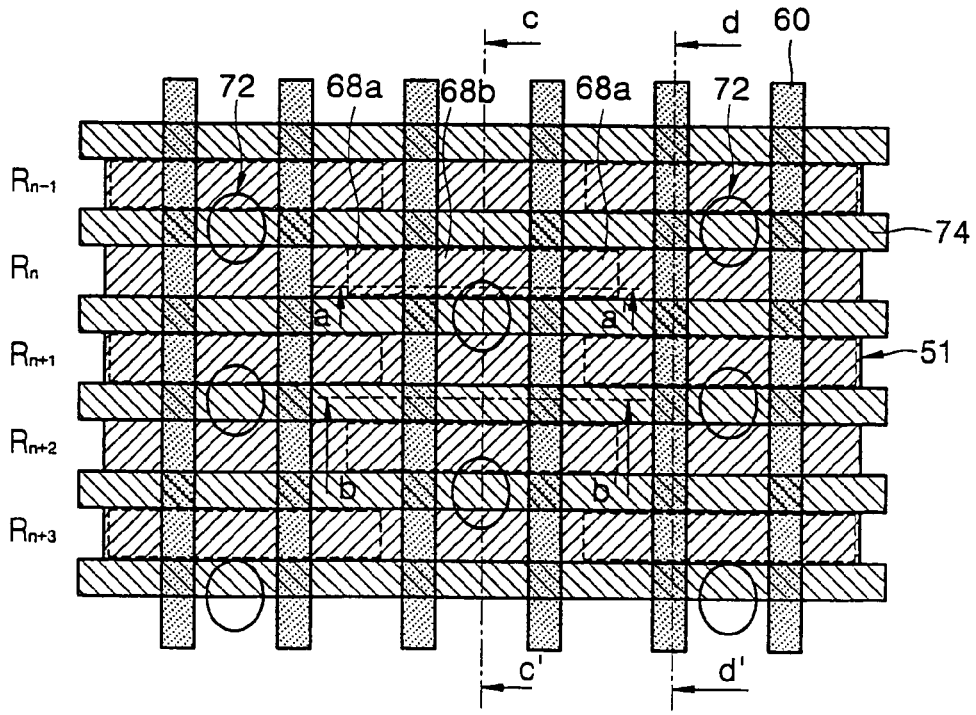
Figure 9A:
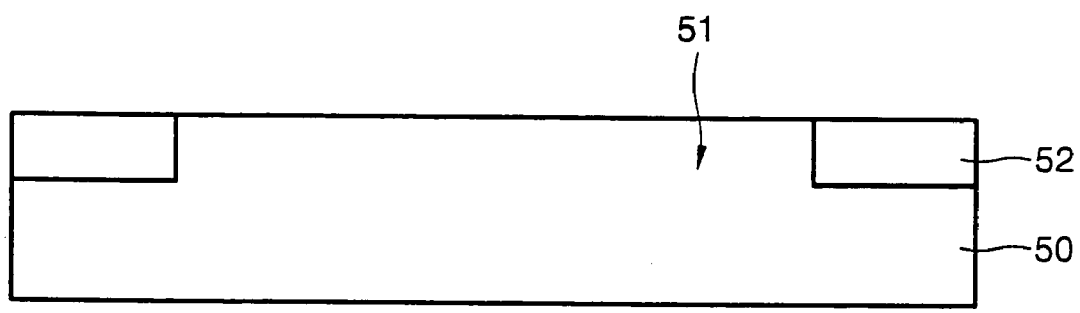
FIGS. 9A through 9D are cross-sectional views of the structure of FIG. 3, taken along lines a–a', b–b', c–c', and d–d', respectively.
Figure 9B:
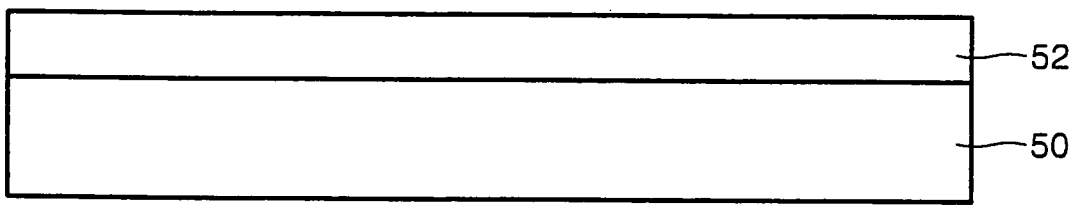
Figure 9C:
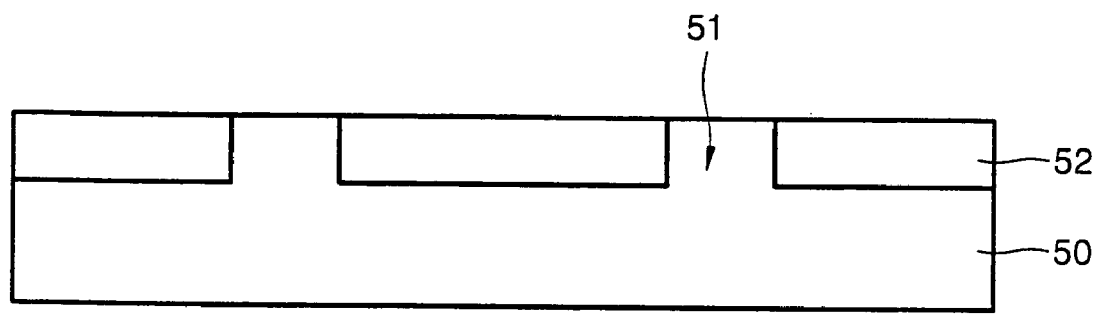
Figure 9D:
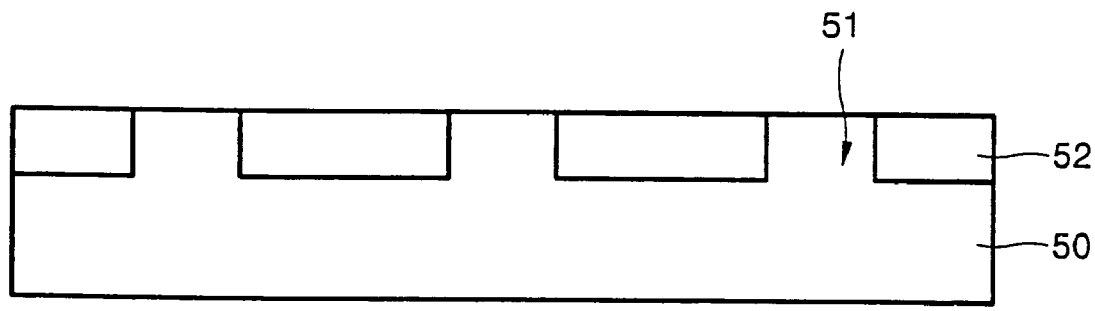
Figure 10A:
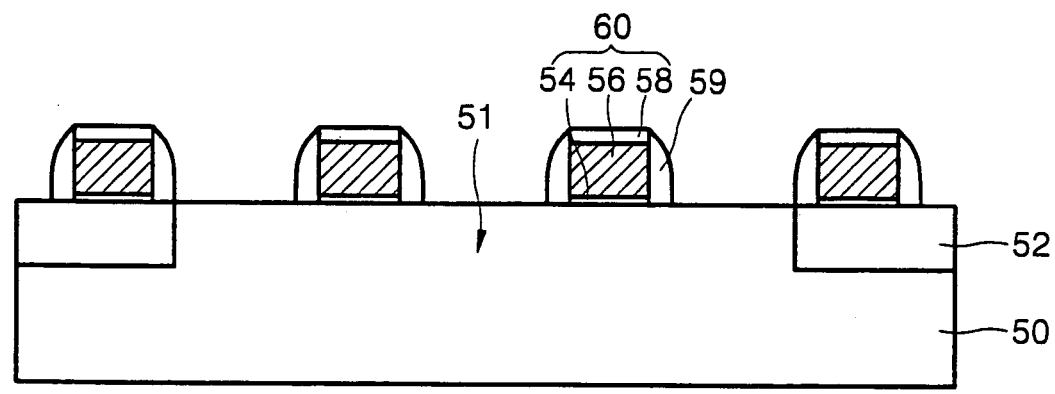
FIGS. 10A through 10D are cross-sectional views of the structure of FIG. 4, taken along lines a–a', b–b', c–c', and d–d', respectively.
Figure 10B:
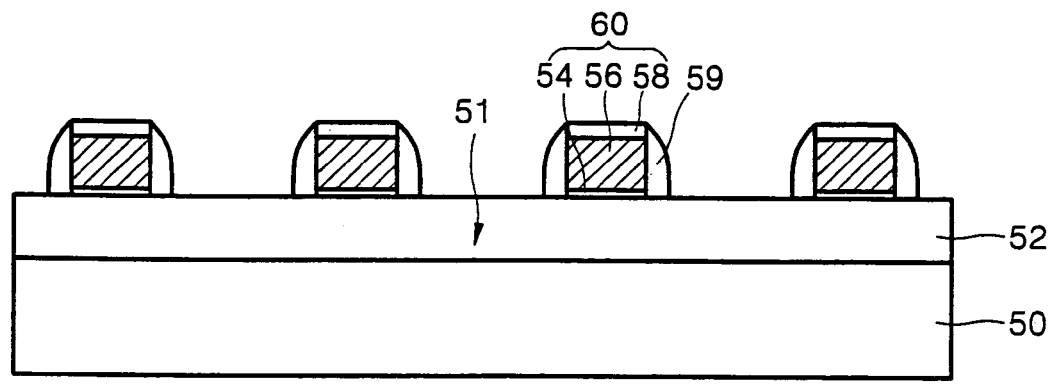
Figure 10C:
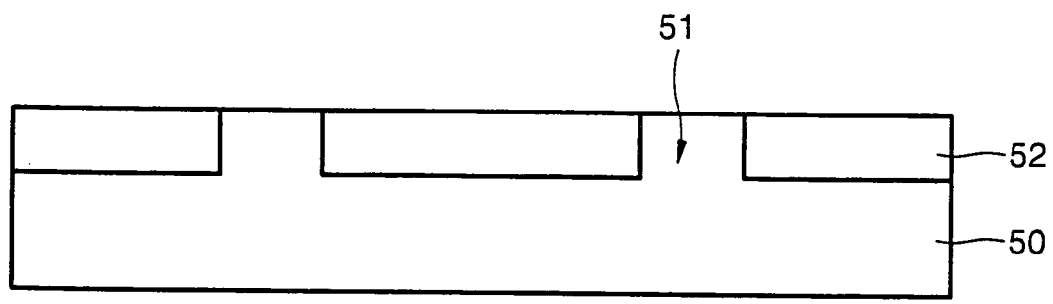
Figure 10D:
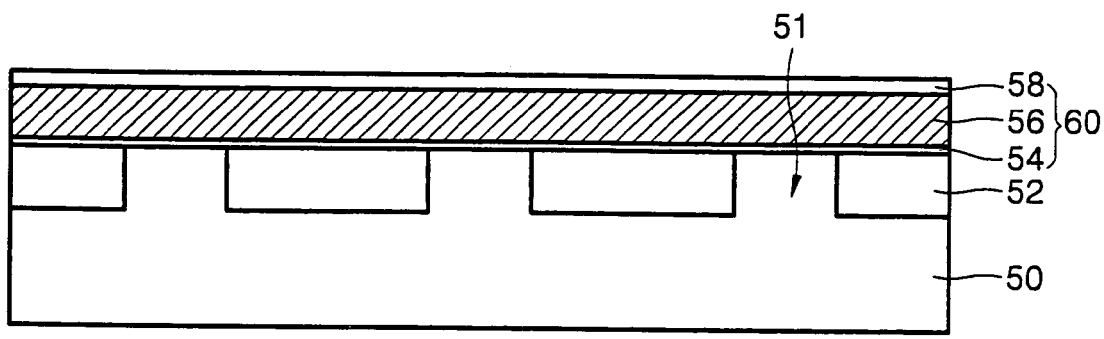
Figure 11A:
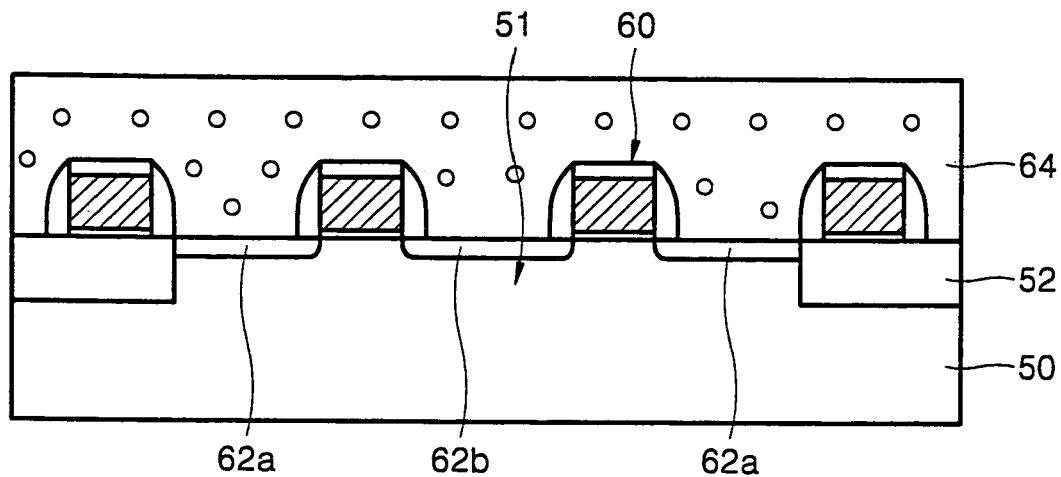
FIGS. 11A through 11D are cross-sectional views of the structure of FIG. 5, taken along lines a–a', b–b', c–c', and d–d', respectively.
Figure 11B:
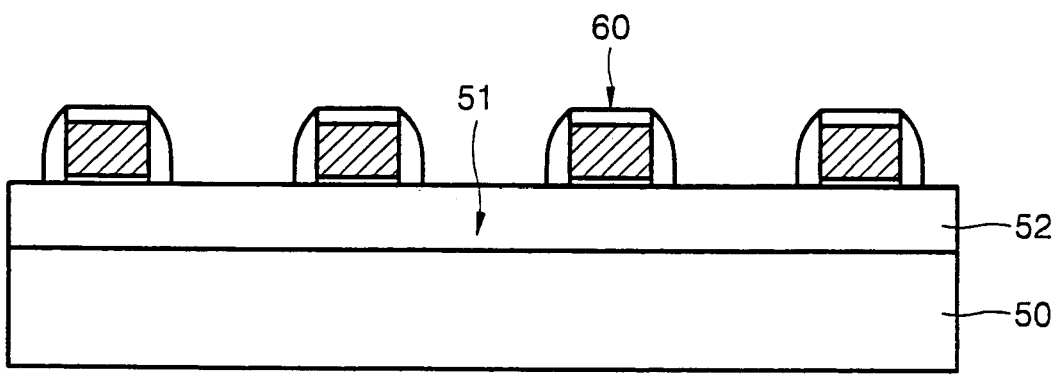
Figure 11C:
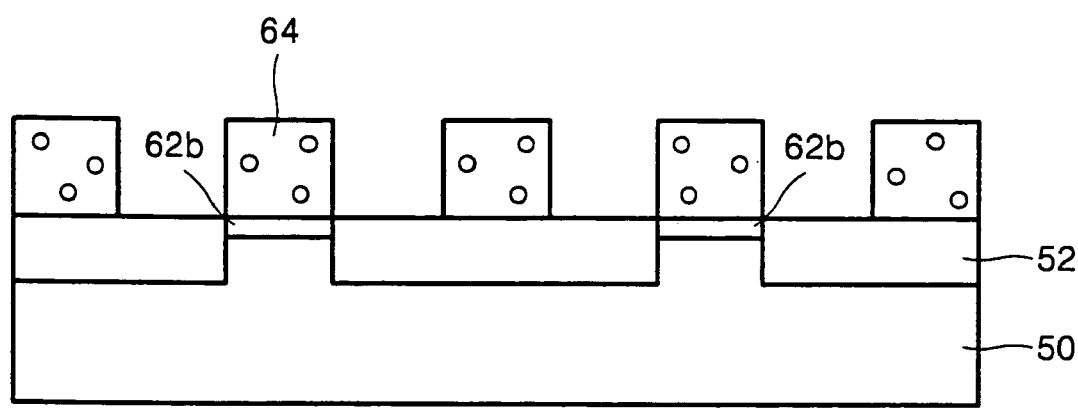
Figure 11D:
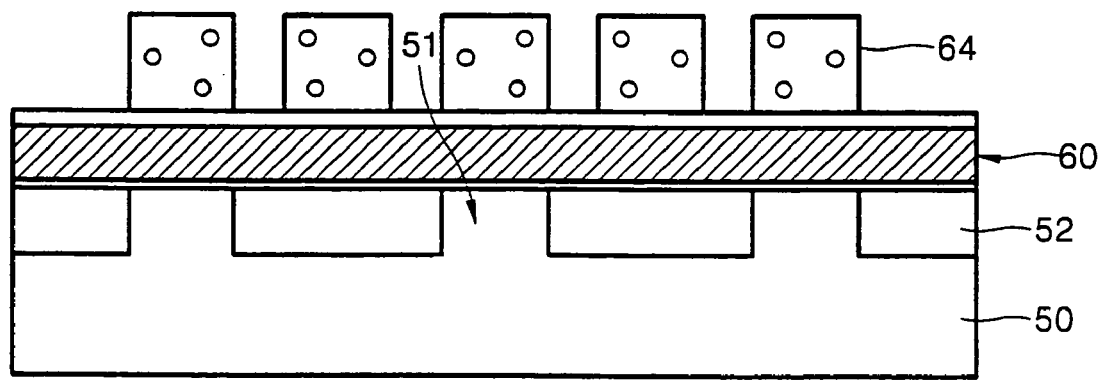
Figure 12A:
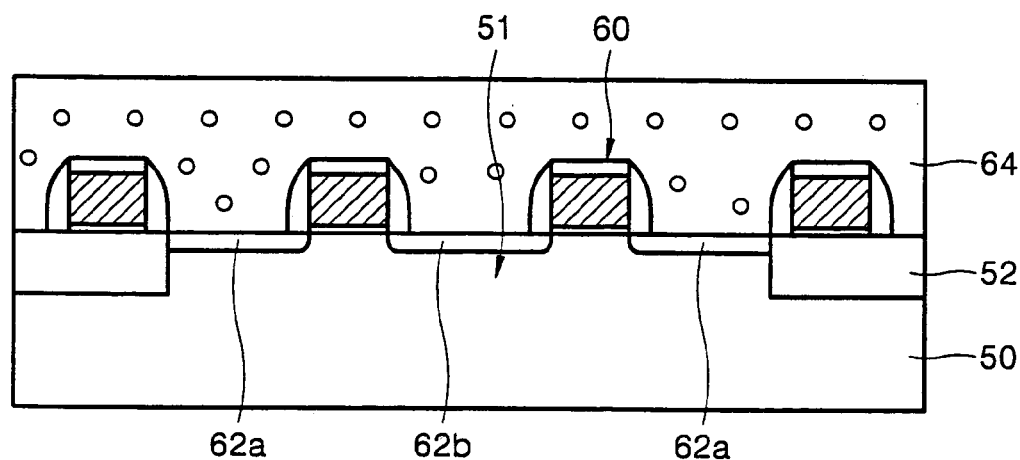
FIGS. 12A through 12D are cross-sectional views of the structure of FIG. 6, taken along lines a–a', b–b', c–c', and d–d', respectively.
Figure 12B:
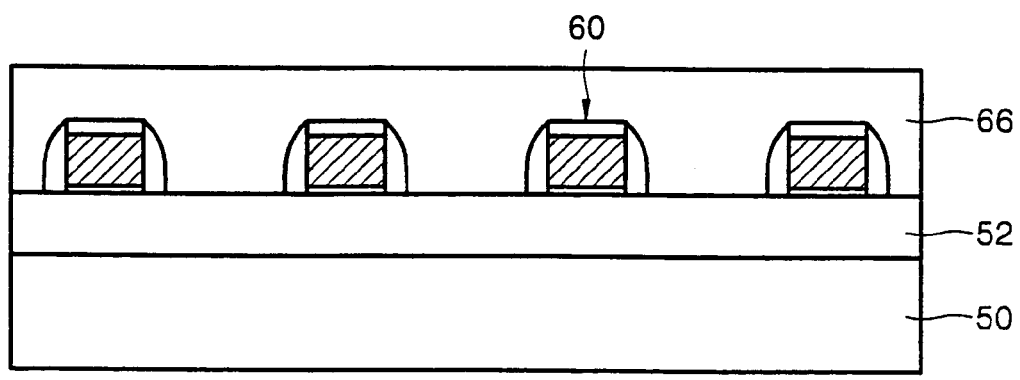
Figure 12C:
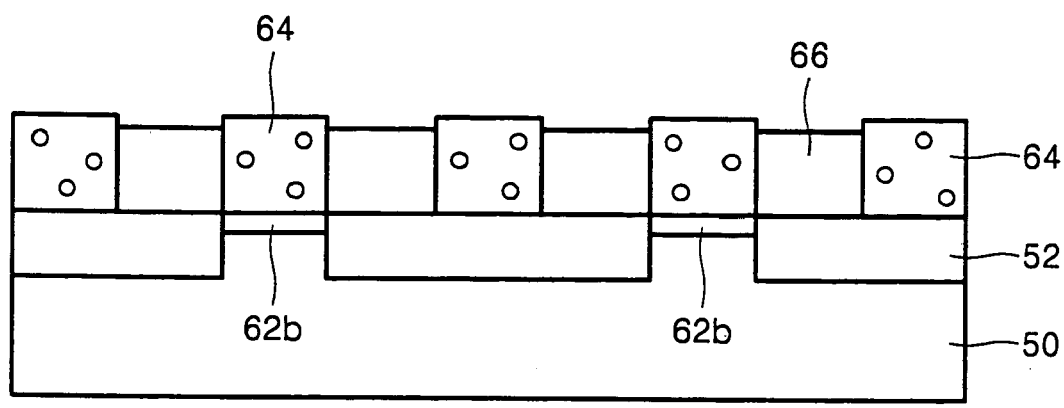
Figure 12D:
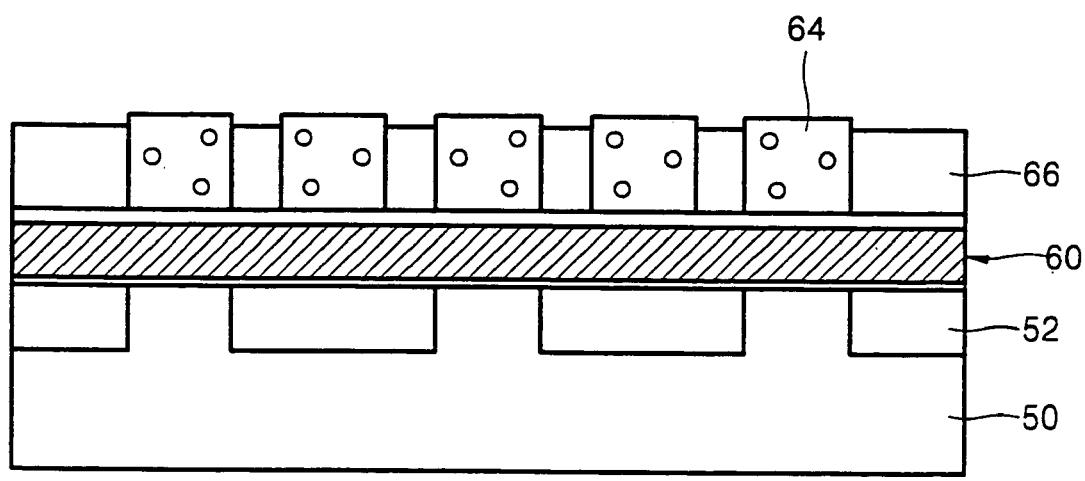
Figure 13A:
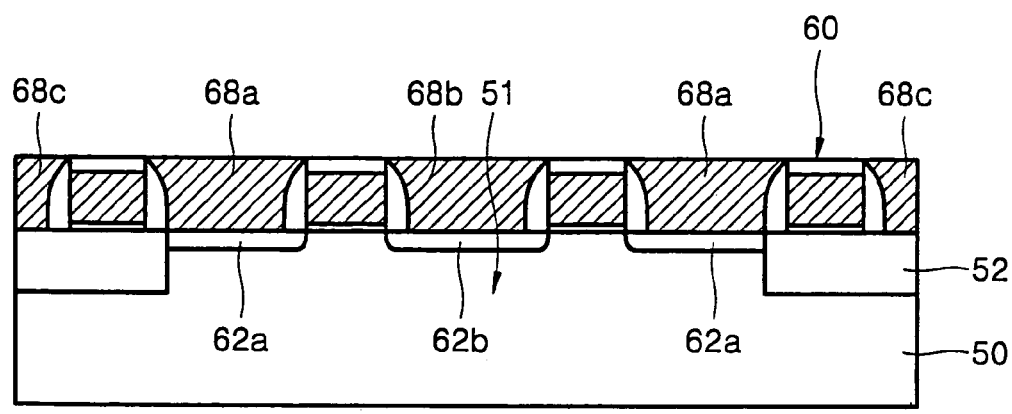
FIGS. 13A through 13D are cross-sectional views of the structure of FIG. 7, taken along lines a–a', b–b', c–c', and d–d', respectively.
Figure 13B:
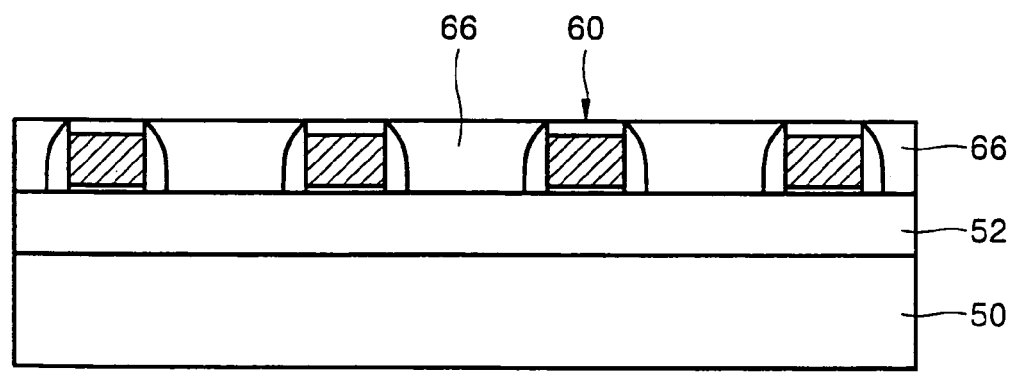
Figure 13C:
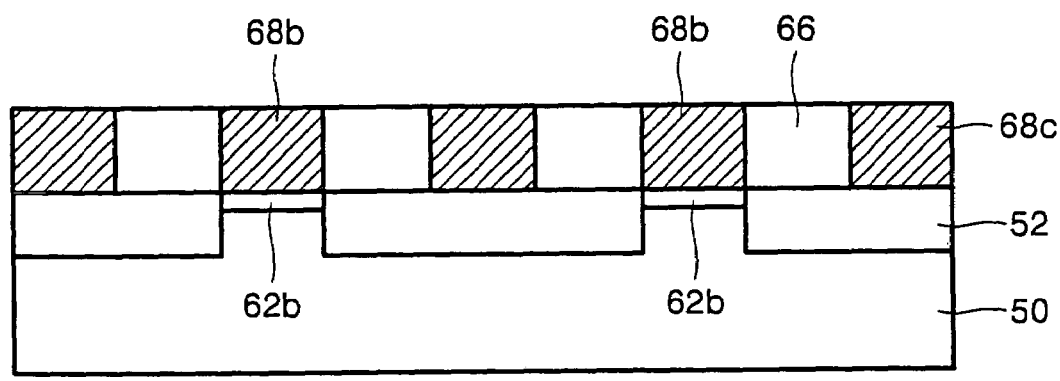
Figure 13D:
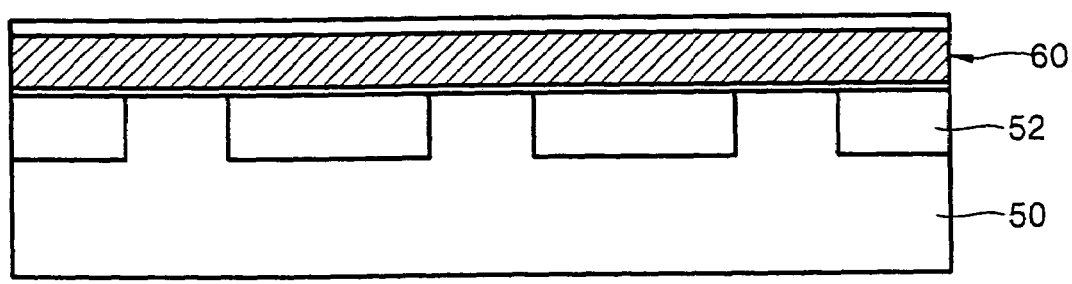

Referring to FIGS. 7 and 13A through 13D, the photoresist patterns 64 may be removed by a well-known plasma ashing method so that the active regions and the isolation layer 52 are exposed through the oxide layer 66. A conductive layer for self-aligned contact pads is deposited on the semiconductor substrate 50 to a thickness sufficient to fill the spaces previously occupied by the photoresist patterns 64. The conductive layer comprises, for example, an impurity-doped polysilicon layer. Next, the conductive layer and the oxide layer 66 are chemically and mechanically polished until the surfaces of the word line structures 60 are exposed, thereby forming first, second, and third self-aligned contact pads 68a, 68b, and 68c in the spaces between the word line structures 60. The first, second, and third self-aligned contact pads 68a, 68b, and 68c are electrically isolated from one another by the word line structures 60 and the oxide layer 66. The first self-aligned contact 68a in contact with the source region 62a and the second self-aligned contact 68b in contact with the drain region 62b are conductive, whereas the third self-aligned contact 68c is floating on the isolation layer 52. The sizes of the first and second self-aligned contacts 68a and 68b may be the same and the third self-aligned contact 68c may be the same size as the first and second self-aligned contacts. As shown in FIG. 7, the first, second, and third self-aligned contact pads 68a, 68b, and 68c are arranged in the horizontal direction.

Figure 14A:
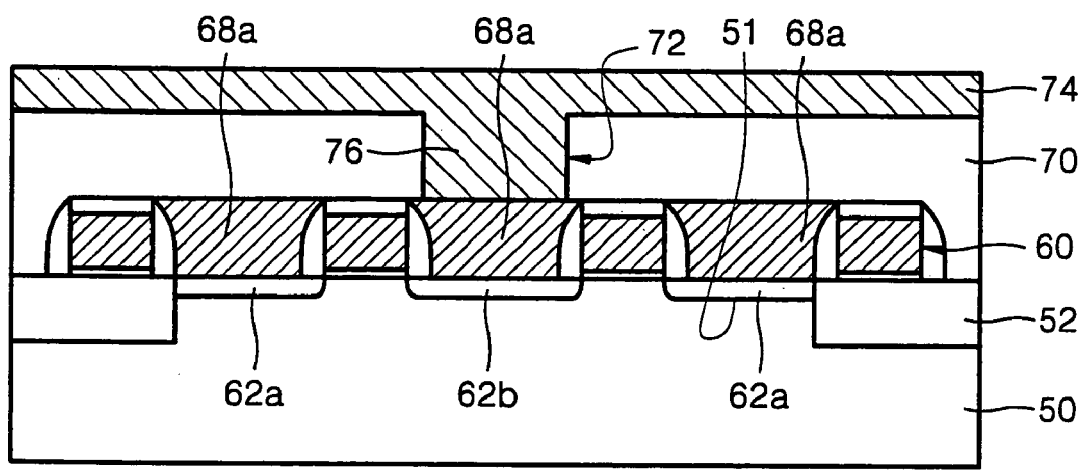
FIGS. 14A through 14D are cross-sectional views of the structure of FIG. 8, taken along lines a–a', b–b', c–c', and d–d', respectively.
Figure 14B:
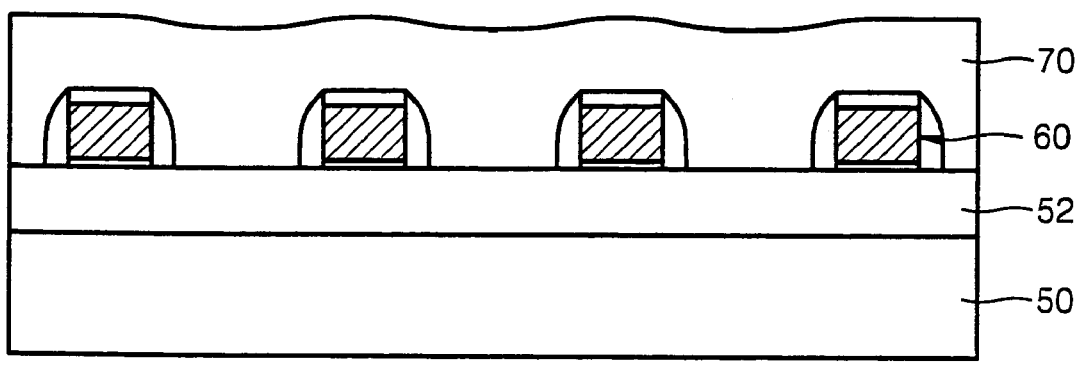
Figure 14C:
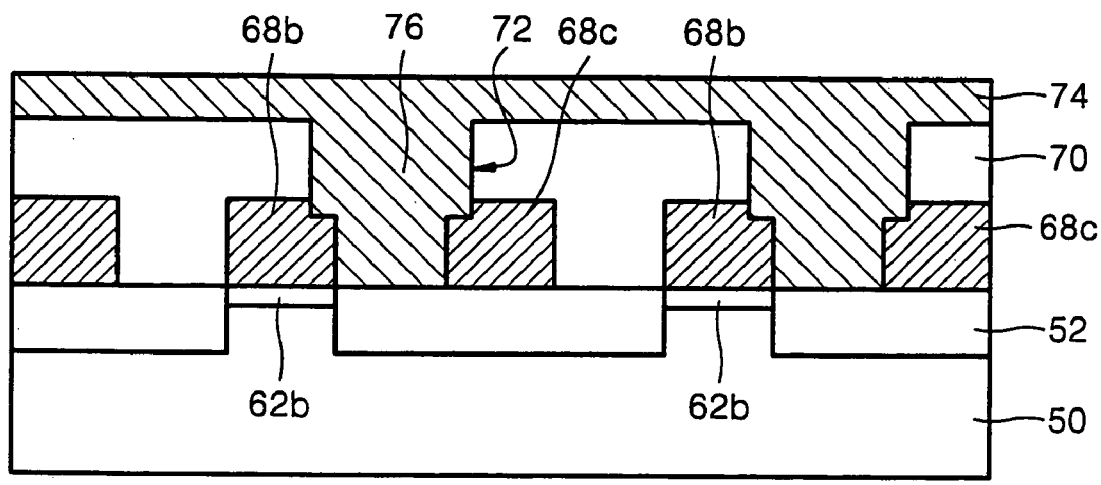
Figure 14D:
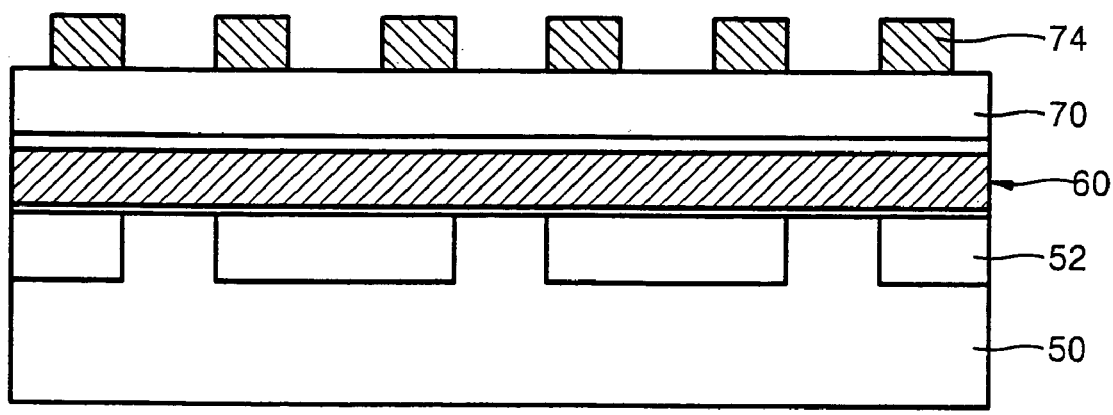

As shown in FIGS. 8 and 14A through 14D, the oxide layer 66 is removed, exposing portions of the isolation layer 52 between the first, second, and third self-aligned contact pads 68a, 68b, and 68c. An interlayer insulating layer 70 is formed on the semiconductor substrate 50 and then etched to expose the second self-aligned contact 68b, thereby forming a bit line contact hole 72. As shown in FIG. 14C, the bit line contact hole 72 is formed so as to expose the second self-aligned contact 68b and the third self-aligned contact 68c. Because an active region 51 belonging to a predetermined row and column is positioned at a location corresponding to a gap between two active regions 51 next to the active region 51, the self-aligned contact adjacent to the second self-aligned contact 68b (in a vertical direction) is the third self-aligned contact 68c floating on the isolation layer 52. Accordingly, even if the second and third self-aligned contact pads 68b and 68c are simultaneously in contact with a bit line, formation of a short can be avoided. In addition, because the bit line contact hole 72 may be formed to expand to the third self-aligned contact 68c as well as the second self-aligned contact 68b, the area of the bit line contact hole 72 can be relatively large. Accordingly, mask alignment for forming the bit line contact hole 72 can be achieved more easily. As shown, the width of the bit line contact hole 72 is greater than the gap between the second and third self-aligned contact pads 68b and 68c.

A conductive layer is formed on the interlayer insulating layer 70, forming a contact plug 76 in the bit line contact hole 72. The conductive layer is patterned so that conductive material remains in spaces between the first, second, and third self-aligned contact pads 68a, 68b, and 68c, which cross the word line structures 60, forming bit lines 74. As shown in FIG. 14C, a bit line 74 contacts the second and third self-aligned contact pads 68b and 68c via the contact plug 76.

As described above, according to some embodiments of the present invention, the photoresist patterns 64 are formed on the cell region except for the rows at which the active regions 51 are formed, in other words, except for the regions at which the bit lines 74 will be formed. The oxide layer 66 is formed to fill spaces between the photoresist patterns 64 at low temperatures. The photoresist patterns 64 are selectively removed, and then a conductive layer is formed so as to sufficiently fill the spaces that were occupied by the photoresist patterns 64. The conductive layer and the oxide layer 66 are chemically and mechanically polished to expose the surfaces of the word line structures 60, thereby forming the self-aligned contact pads 68a, 68b, and 68c. The oxide layer 66 is then removed.

Accordingly, the self-aligned contact pads 68a, 68b, and 68c can be formed without performing a photolithographic process for selectively exposing the active regions 51. Since this photolithographic process can be omitted, problems such as bridge formation can be reduced. In addition, if the photolithographic process for exposing self-aligned contact regions is not performed, each of the self-aligned contact pads 68a, 68b, and 68c can have the same size, which can reduce etching irregularities.

Figure 15:
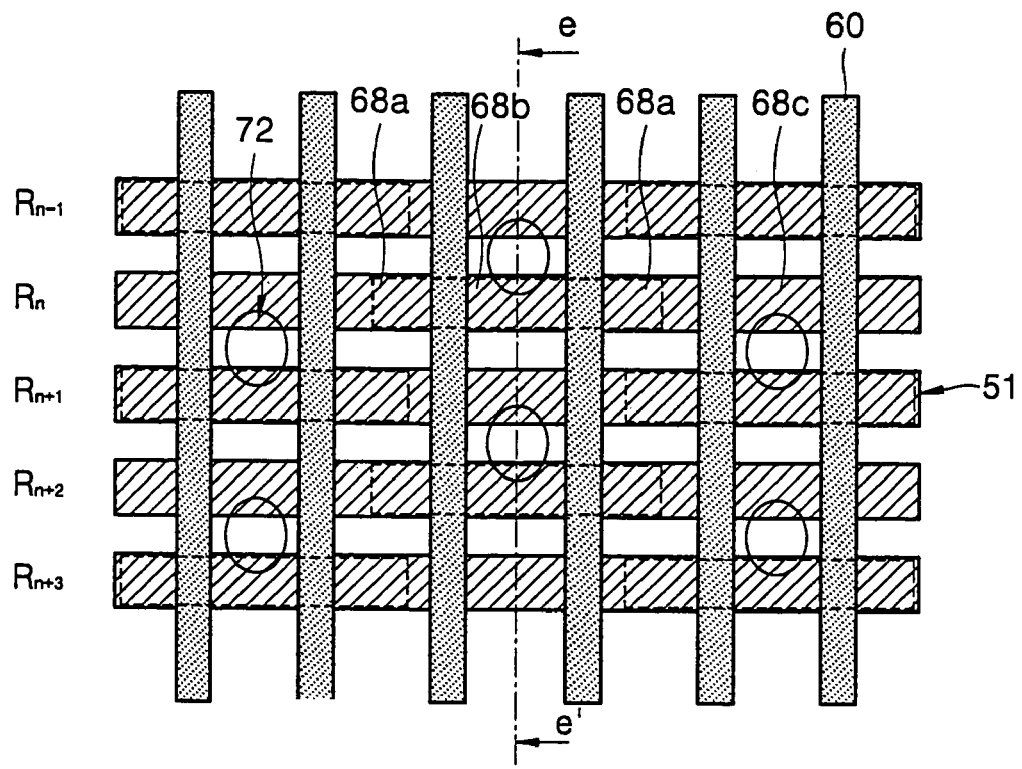
FIG. 15 is a plan view illustrating fabrication products and operations according to further embodiments of the present invention.
Figure 16:
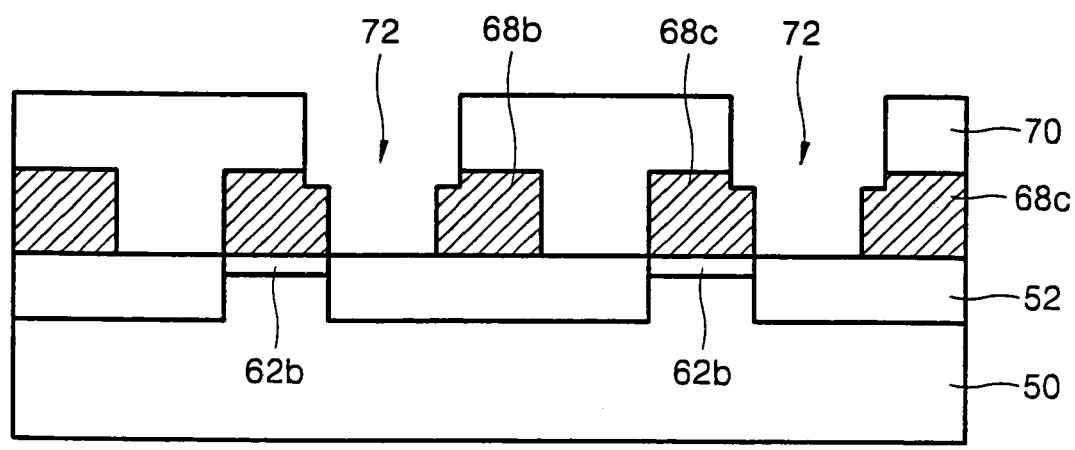
FIG. 16 is a cross-sectional view of the structure of FIG. 15, taken along a line e–e'.

FIGS. 15 and 16 illustrate an alternative arrangement of contact holes 72 according to further embodiments of the present invention. A structure is fabricated as described above with reference to FIGS. 3–7 and 9–13. Referring to FIGS. 15 and 16, portions of an interlayer insulating layer 70 are etched to expose the second self-aligned contact pad 68b in contact with the drain region 62b. In particular, a second self-aligned contact pad 68b belonging to a row Rn and a third self-aligned contact pad 68c, which is floating on an isolation region 52 and belongs to a previous row Rn–1 and is in the same column as the second self-aligned contact pad 68c, are exposed by the same contact hole 72

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a integrated circuit memory device comprising:
    forming an isolation layer so as to define a plurality of active regions arranged a predetermined distance apart in column and row directions on a semiconductor substrate;
    forming a plurality of word line structures extending in a column direction on the active regions and the isolation layer;
    forming a source region and a drain region by implanting impurities in the active regions at either side of each of the word line structures;
    forming photoresist patterns at the rows at which the active regions are formed;
    filling spaces between the photoresist patterns with a low temperature oxide layer;
    removing the photoresist patterns; and
    forming self-aligned contact pads to have the same height as the word line structures in spaces in the low temperature oxide layer and spaces between the word line structures.

2. The method of claim 1, wherein a pair of word line structures is disposed in each of the active regions and is arranged to cross each of the active regions.

3. The method of claim 2, wherein forming the word line structures comprises:
    forming a gate insulating layer on a semiconductor substrate;
    forming a conductive layer on the gate insulating layer;
    forming a capping layer on the conductive layer;
    patterning predetermined portions of the capping layer and the conductive layer; and
    forming insulating spacers at either side of the patterned conductive layer and capping layer.

4. The method of claim 1, wherein forming the photoresist patterns comprises:
    coating the semiconductor substrate with a photoresist layer; and
    exposing and developing the photoresist layer so that the photoresist layer is left only at the rows at which the active regions are formed.

5. The method of claim 1, wherein filling the spaces between the photoresist patterns with the low temperature oxide layer comprises:
    depositing an oxide layer within a low temperature range so as not to cause the photoresist patterns to be deformed; and
    filling only the spaces between the photoresist patterns with the oxide layer by etching back the oxide layer until the surfaces of the photoresist patterns are exposed.

6. The method of claim 5, wherein the oxide layer is deposited at a temperature of 150 and 250° C.

7. The method of claim 1, wherein forming the self-aligned contact pads comprises:
    depositing a conductive layer so as to sufficiently fill the spaces in the low temperature oxide layer; and
    chemically and mechanically polishing the conductive layer and the low temperature oxide layer so as to expose the surfaces of the word line structures.

8. The method of claim 1, after forming the self-aligned contact pads, further comprising:
    depositing an interlayer insulating layer on the semiconductor substrate;
    forming a contact hole by etching the interlayer insulating layer so that the self-aligned contact pad in contact with the drain region and the self-aligned contact pad formed on the isolation layer and belonging to the same column as the self-aligned contact pad in contact with the drain region but to a row prior to or next to the row to which the self-aligned contact pad in contact with the drain region belongs are simultaneously exposed; and
    forming a bit line on the interlayer insulating layer so as to be contacted with both the self-aligned contact pad in contact with the exposed drain region and the self-aligned contact pad formed on the isolation layer.

9. A method for manufacturing a integrated circuit memory device comprising:
    forming an isolation layer so as to define a plurality of active regions arranged a predetermined distance apart in column and row directions on a semiconductor substrate;
    forming a plurality of word line structures extending in a column direction on the active regions and the isolation layer;
    forming a source region and a drain region by implanting impurities in the active regions at either side of each of the word line structures;
    forming photoresist patterns at the rows at which the active regions are formed;
    filling spaces between the photoresist patterns with a low temperature oxide layer;
    removing the photoresist patterns;
    forming self-aligned contact pads to have the same height as the word line structures in spaces in the low temperature oxide layer and spaces between the word line structures;
    depositing an interlayer insulating layer on the semiconductor substrate;
    forming a contact hole by etching the interlayer insulating layer so that the self-aligned contact pad in contact with the drain region and the self-aligned contact pad formed on the isolation layer and belonging to the same column as the self-aligned contact pad in contact with the drain region but to a row prior to or next to the row to which the self-aligned contact pad in contact with the drain region belongs are simultaneously exposed; and forming a bit line on the interlayer insulating layer so as to be contacted with both the self-aligned contact pad in contact with the exposed drain region and the self-aligned contact pad placed on the isolation layer, wherein filling the spaces between the photoresist patterns with the low temperature oxide layer comprises:

depositing an oxide layer within a low temperature range so as not to cause the photoresist patterns to be deformed; and filling only the spaces between the photoresist patterns with the oxide layer by etching back the oxide layer until the surfaces of the photoresist patterns are exposed.

10. The method of claim 9, wherein a pair of word line structures is disposed in each of the active regions and is arranged to cross the active regions.

11. The method of claim 10, wherein forming the word line structures comprises:

forming a gate insulating layer on a semiconductor substrate;

forming a conductive layer on the gate insulating layer;

forming a capping layer on the conductive layer;

patterning predetermined portions of the capping layer and the conductive layer; and forming insulating spacers at either side of the patterned conductive layer and capping layer.

12. The method of claim 1, wherein forming the photoresist patterns comprises:

depositing a photoresist layer on the semiconductor substrate; and exposing and developing the photoresist layer so that the photoresist layer is left only at the rows at which the active regions are formed.

13. The method of claim 1, wherein the oxide layer is deposited at a temperature of 150 and 250° C.

14. The method of claim 9, wherein forming the self-aligned contact pads comprises:

depositing a conductive layer so as to sufficiently fill the spaces in the low temperature oxide layer; and chemically and mechanically polishing the conductive layer and the low temperature oxide layer to expose the surfaces of the word line structures.

* * * * *